(12) United States Patent
Lee

(10) Patent No.: US 7,697,359 B2
(45) Date of Patent: Apr. 13, 2010

(54) FLASH MEMORY DEVICE AND REFRESH METHOD THEREOF

(75) Inventor: Jong-Soo Lee, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 363 days.

(21) Appl. No.: 11/783,173

(22) Filed: Apr. 6, 2007

(65) Prior Publication Data

US 2008/0068912 A1   Mar. 20, 2008

(30) Foreign Application Priority Data

Sep. 19, 2006   (KR)   .................... 10-2006-0090867

(51) Int. Cl.
*G11C 7/00* (2006.01)
(52) U.S. Cl. .................... 365/222; 365/226; 365/238.5
(58) Field of Classification Search ................ 365/222, 365/226, 238.5
See application file for complete search history.

(56) References Cited

U.S. PATENT DOCUMENTS

| | | | |
|---|---|---|---|
| 6,169,691 B1 | 1/2001 | Pasotti et al. | |
| 6,636,440 B2 * | 10/2003 | Maayan et al. | 365/185.25 |
| 7,006,383 B2 | 2/2006 | Tanaka | |
| 7,099,200 B2 | 8/2006 | Sakui | |
| 7,184,308 B2 * | 2/2007 | Kwon et al. | 365/185.17 |
| 7,266,034 B2 * | 9/2007 | Hirai et al. | 365/222 |
| 7,307,908 B2 * | 12/2007 | Gilton | 365/222 |
| 7,310,271 B2 * | 12/2007 | Lee | 365/185.22 |
| 2004/0151031 A1 | 8/2004 | Tanaka | |
| 2007/0006383 A1 | 1/2007 | Ogle et al. | |
| 2007/0099200 A1 | 5/2007 | Chow et al. | |

FOREIGN PATENT DOCUMENTS

| | | |
|---|---|---|
| JP | 2000-011670 | 1/2000 |
| JP | 2004-240572 | 8/2004 |
| JP | 2005-182909 | 7/2005 |

* cited by examiner

*Primary Examiner*—Pho M. Luu
(74) *Attorney, Agent, or Firm*—Volentine & Whitt, PLLC

(57) ABSTRACT

A method for refreshing a flash memory device includes providing first and second refresh fields that include a plurality of memory blocks, and determining, when there is a request for a refresh, a condition of a memory block to be refreshed in accordance with which of the first and second refresh fields includes the memory block to be refreshed.

27 Claims, 11 Drawing Sheets

FLASH MEMORY DEVICE AND REFRESH METHOD THEREOF

BACKGROUND OF THE INVENTION

1. Field of the Invention

The present disclosure relates generally to semiconductor memory devices and, more particularly, to electrically erasable and programmable flash memory devices.

A claim of priority under 35 U.S.C. §119 is made to Korean Patent Application No. 2006-90867 filed on Sep. 19, 2006, the entire contents of which are hereby incorporated by reference.

2. Description of the Related Art

Semiconductor memory devices are generally divided into volatile memory devices and nonvolatile memory devices. Nonvolatile memory devices are those which can retain stored data even in the absence of power supply. On the other hand, volatile memory devices are those who lose stored data in the event of a power loss. Flash memories are one kind of nonvolatile memory. There are various types of flash memories such as, for example, programmable read-only memories (PROM), erasable and programmable read-only memories (EPROM), and electrically erasable and programmable read-only memories (EEPROM).

In addition to retaining stored data in the event of a power loss, flash memories are also more resistant to physical shocks and have faster access times for reading as compared to other memory devices. Because of these and other such features, flash memories are widely used as storage units in electronic apparatuses powered up by batteries. Furthermore, data is stored in a flash memory in memory blocks, each block including a plurality of memory cells. Generally, the memory cells are transistors which store data in the form of a voltage level. In addition, in single bit memory cells, each memory cell stores 1-bit data, but in multi-level memory cells, each memory cell includes at least 2-bit data.

In EEPROMs, programming and erasing operations are carried out by performing these operations in a plurality of memory blocks. To this end, generally, an EEPROM is erasable or programmable one memory block at a time. This means that EEPROMs may operate more rapidly and effectively during reading and writing operations by reading and writing data from and to multiple memory blocks in the EEPROM at the same time. The memory blocks in EEPROMs include insulation films. These films enclose charge storage elements. Charge storage elements are components used to retain data stored in the memory blocks. While these films may be used to protect the charge storage elements from undesirable electrical side-effects, these insulation films will wear out at some point as the number of reading and writing operations increase.

Thus, it is important to analyze the reliability of a flash memory device based on the available number of programming/erasing cycles (or endurance by operations), such that there is no degradation in data retention characteristics and data quality. There may be many other problems associated with the number of programming/erasing cycles in a flash memory device. For example, stored charges (or electrons) may easily leak out of the floating gate of a transistor because of various mechanical/electrical failures. These failures may include, for example, emission of thermions, charge diffusion, drifts of ionic impurities, stress by program disturbance, and so on. Furthermore, these failures are likely to decrease the threshold voltage of each memory cell in a memory block.

On the other hand, when the control gate of a transistor is held at a power source voltage, charges accumulate in the floating gate. This may lead to an increase in the threshold voltage of the memory cell. Furthermore, repetitive programming/erasing cycles may stress the oxide films of memory transistors and cause failures such as, for example, breakdowns of tunnel oxide films in the flash memory device. Such a failure may also lead to lower threshold voltages in memory cells. That is, under such conditions, charges would normally leak out of the floating gate of a programmed memory cell. As a result, as noticed by the broken line in FIG. 1, distribution profiles of programmed memory cells may move toward the lower voltages. Thus, there may be memory cells (those belonging to the shadow part) having threshold voltages lower than a program-verifying voltage. A program-verifying voltage is a voltage applied to a memory cell to ensure that the cell has been properly programmed. Because the threshold voltages of some memory cells may be lower than the program-verifying voltage, there may be errors in the program verifying operation. For example, if a memory cell has been programmed and has a program verify voltage of 5 v, if the threshold voltage of the cell drops below 5 v, a program verifying voltage applied to the cell may indicate that the memory cell has not been programmed although, in reality, the cell was programmed.

Thus, there is a need for structures and methods of programming flash memory devices which allow for repeated programming/erasing operations in the memory devices without causing as many electrical/mechanical failures as in conventional flash memory devices.

The present disclosure is directed towards overcoming one or more shortcomings associated with the conventional flash memory devices.

SUMMARY OF THE INVENTION

One aspect of the present disclosure includes a method for refreshing a flash memory device. The method includes providing first and second refresh fields that include a plurality of memory blocks, and determining, when there is a request for a refresh, a condition of a memory block to be refreshed in accordance with which of the first and second refresh fields includes the memory block to be refreshed.

Another aspect of the present disclosure includes a method for refreshing a flash memory device. The method includes providing first and second refresh fields that include a plurality of memory blocks, reading time slot information including data associated with times for programming the memory blocks, from the first and second refresh fields, determining, when there is a request for a refresh, which of the first and second refresh fields includes the memory block to be refreshed, selecting one of first and second reference times which are compared with the programming time of the time slot information corresponding to the memory block to be refreshed, and executing a refresh operation in accordance with whether the programming time of the time slot information corresponding to the memory block to be refreshed is longer than the selected reference time.

Another aspect of the present disclosure includes a method for refreshing a flash memory device. The method includes providing first and second refresh fields that include a plurality of memory blocks, determining, when there is a request for a refresh, one of first and second refresh-verifying voltages which detect a memory block to be refreshed in accordance with which of the first and second refresh fields includes the memory block to be refreshed, and executing a refresh operation based on the determined refresh-verifying voltage.

Yet another aspect of the present disclosure includes a method for refreshing a flash memory device. The method includes providing first and second refresh fields including a plurality of memory blocks, reading time slot information including data associated with times for programming the memory blocks, from the first and second refresh fields, determining, when there is a request for a refresh, which of the first and second refresh fields includes the memory block to be refreshed, selecting one of first and second reference times which are compared with the programming time of the time slot information corresponding to the memory block to be refreshed, determining, when the programming time of the time slot information corresponding to the memory block to be refreshed is longer than the selected reference time, one of first and second refresh-verifying voltages which detect a memory cell to be refreshed, and executing a refresh operation based on the determined refresh-verifying voltage.

Another aspect of the present disclosure includes a method for refreshing a flash memory device. The method includes providing first and second refresh fields including a plurality of memory blocks, and refreshing a selected memory block when there is a request for a refresh, wherein a refresh cycle for the memory blocks of the first refresh field is longer than a refresh cycle for the memory blocks of the second refresh field.

Yet another aspect of the present disclosure includes a flash memory device. The flash memory device includes a memory cell array including a plurality of memory blocks divided into first and second refresh fields, a controller, which upon receipt of a request for refresh, determines which of the first and second refresh fields includes a memory block to be refreshed, wherein the controller is configured to ascertain a refresh condition for the memory block to be refreshed in accordance with a result of the determination.

A further understanding of the nature and features of the present invention herein may be realized by reference to the remaining portions of the specification and the attached drawings.

BRIEF DESCRIPTION OF THE FIGURES

Exemplary embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
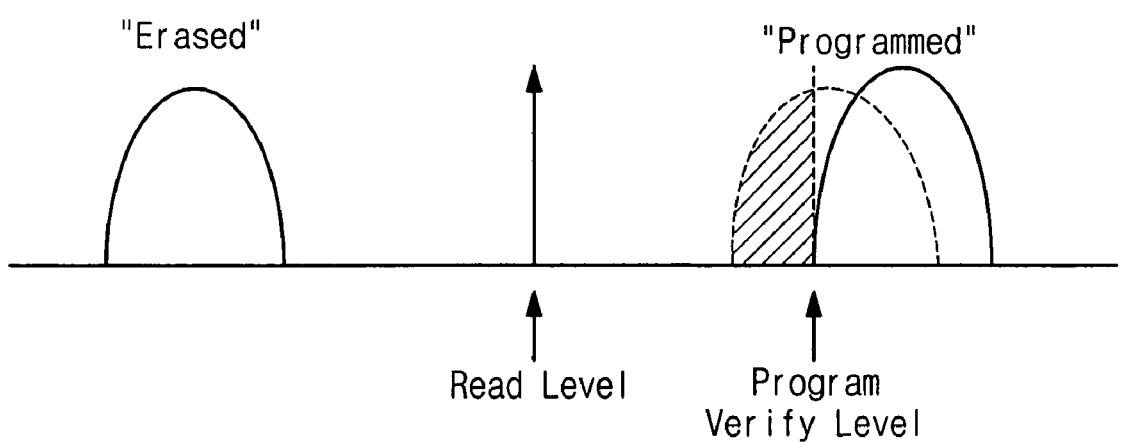
FIG. 1 is a diagram showing variations of threshold voltages because of charge loss in a flash memory device.

Exemplary embodiments of the present disclosure will be described below in more detail with reference to the accompanying drawings, showing a flash memory device as an example for illustrating structural and operational features of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

A flash memory device according to an exemplary embodiment is configured to conduct a refresh operation on basis of refresh parameters (e.g., refresh cycle time, refresh-verifying voltage, etc) that are differentially applied to a storage field with a relatively smaller number of programming/erasing cycles (e.g., an area storing code data) and a storage with a relatively larger number of programming/erasing cycles field (e.g., an area storing normal data). By applying the refresh operation on a selective basis instead of applying it uniformly (as done in conventional cases), the functional degradation of the flash memory device may be reduced.

Figure 2:
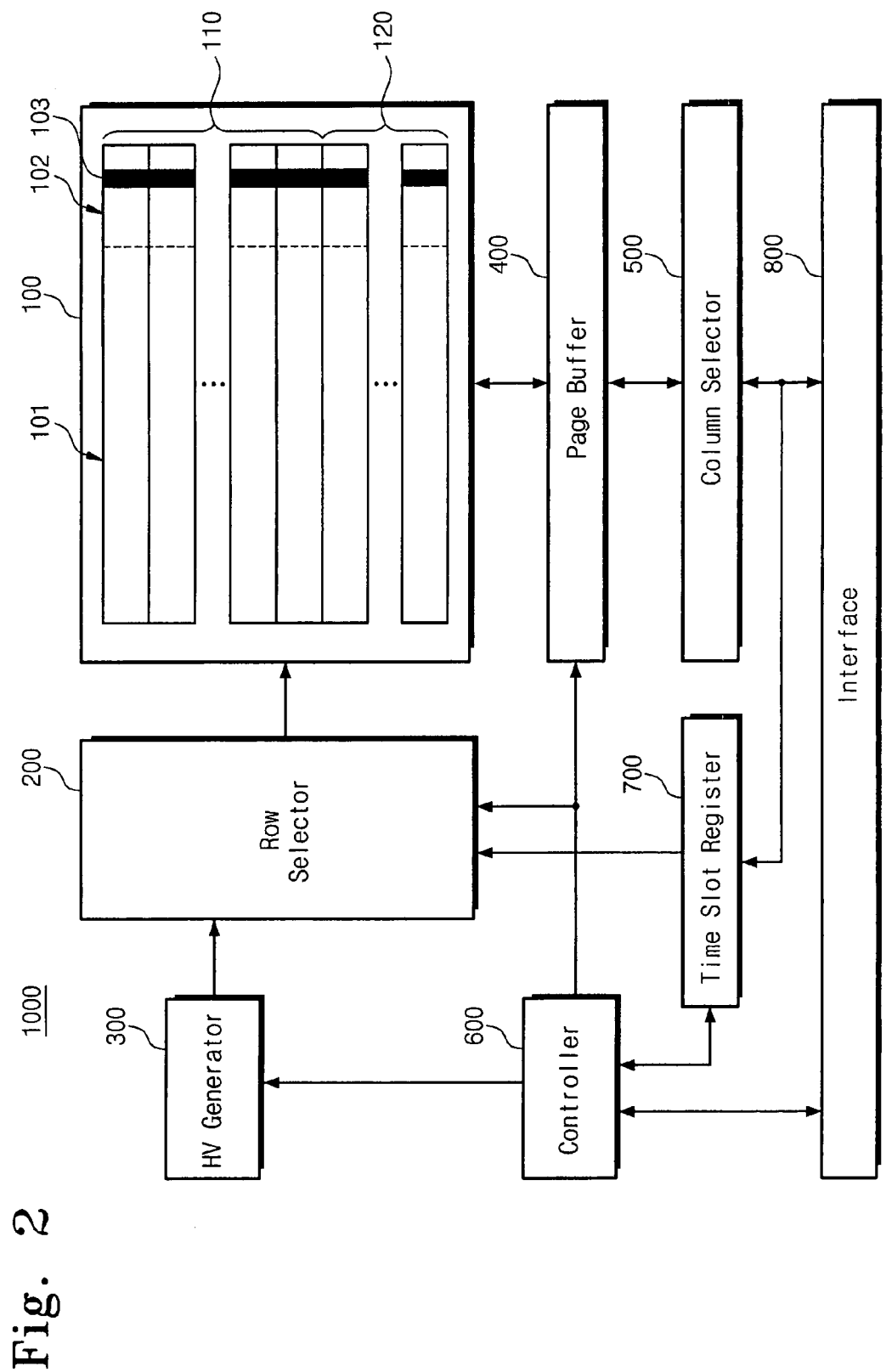
FIG. 2 is a block diagram illustrating a flash memory device in accordance with an exemplary disclosed embodiment.

FIG. 2 is a block diagram illustrating a flash memory device in accordance with an exemplary embodiment. Referring to FIG. 2, the flash memory device 1000 is comprised of a memory cell array 100 which stores N-bit data information (N is a positive integer). The memory cell array 100 is segmented into first and second storage fields 110 and 120. Each of the first and second storage fields 110 and 120 may be composed of pluralities of memory blocks. Furthermore, each memory block is organized in a structure of NAND string that is well known by those skilled in the art. An exemplary structure of the memory block is disclosed in U.S. Pat. No. 5,696,717 entitled 'NONVOLATILE INTEGRATED CIRCUIT MEMORY DEVICES HAVING ADJUSTABLE ERASE/PROGRAM THRESHOLD VERIFICATION CAPABILITY', U.S. Pat. No. 6,058,048 entitled 'FLASH MEMORY DEVICE USED AS A BOOT-UP MEMORY IN A COMPUTER SYSTEM', U.S. Pat. No. 6,813,184 entitled 'NAND FLASH MEMORY AND METHOD OF ERASING, PPROGRAMMING, AND COPY-BACK PROGRAMMING THEREOF', and U.S. Pat. No. 6,930,919 entitled 'NAND-TYPE FLASH MEMORY DEVICE HAVING ARRAY OF STATUS CELLS FOR STORING BLOCK ERASE/PROGRAM INFORMATION', all of which are incorporated herein by reference.

In the first and second storage fields 110 and 120, each memory block includes main and spare regions 101 and 102, respectively. The main region 101 stores normal/code data while the spare region 102 stores information relevant to the main region 101 and the normal/code data stored in the main region 101. For example, the spare region 102 stores error check and correction (ECC) data, programming/erasing (P/E) cycle data, etc. Specifically, in an exemplary embodiment, the spare region 102 stores time slot information 103 about the memory blocks. The time slot information 103 includes time data that represents a point of programming the memory block (or a page of the memory block) and is stored in the spare region 102 when the memory block is programmed. It should be understood by those skilled in the art that the time slot information may be stored in a region other than the spare region 103. For example, the time slot information may be stored in the main region 101 of a specific memory block. Alternatively, the time slot information may be stored in an additional special storage area that also operates with non-volatile characteristics.

As illustrated in FIG. 2, the flash memory device 1000 also includes a row selector 200, a high voltage generator 300, a page buffer circuit 400, a column selector 500, a controller 600, a time slot register 700, and an interface block 800.

The column selector 200 is configured to select one of the memory blocks and then to select one of rows (or pages) from the selected block, while being regulated by the controller 600. Furthermore, a selected row (or page) is driven by the row selector 200 with a word line voltage provided from the high voltage generator 300. As is well known, the high voltage generator 300 is configured to generate a variety of word line voltages such as a program voltage, an erasing voltage, a read voltage, programming/erasing voltages, refresh-verifying voltages, etc. In particular, the high voltage generator 300 operates to generate the refresh-verifying voltages that differ from each other in voltage level. The voltage level of each refresh-verifying voltage may depend on different criteria. For example, a level of the refresh-verifying voltage may be determined in accordance with which storage field includes a memory block that requires a refresh operation.

The types of storage field requiring a refresh operation may be categorized depending on a number of factors. For example, the storage fields requiring refresh-verifying voltages may be differentiated based on area. That is, one storage field may have an area with a relatively smaller number of programming/erasing cycles (hereinafter, referred to as 'lower P/E cycle area') and the other field with a relatively larger number of programming/erasing cycles (hereinafter, referred to as 'higher P/E cycle area'). Furthermore, the storage fields may be divided into an area for storing normal data (hereinafter, referred to as 'normal data area') and the other field for storing code data (hereinafter, referred to as 'code data area'). Because the normal data has lower reliability than the code data, the normal data area may be called a low reliability region while the code data area may be called a high reliability region. For convenience of description, the lower P/E cycle area and the normal data area are together referred to as a first refresh field, while the higher P/E cycle area and the code data area are together referred to as a second refresh field. In an exemplary embodiment, a refresh-verifying voltage generated when a memory block requiring a refresh operation is included in the first refresh operation is lower than a refresh-verifying voltage generated when a memory block requiring a refresh operation is included in the second refresh operation.

The page buffer circuit 400 is configured to read/write data from/into the memory cell array 100 while being regulated by the controller 600. The page buffer circuit 400, although not shown, may be composed of plural page buffers, each corresponding to columns (or bit lines) of the memory cell array 100. Alternatively, the page buffer circuit 400 may be composed of plural page buffers, each corresponding to pairs of bit lines. Furthermore, each page buffer may be formed to read or program 1-bit data. Alternatively, each page buffer may be formed to read or program 2-bit data. Moreover, a structure of the page buffer is not restrictive hereto, but may be alterable or modifiable in accordance with structural and functional circumstances of use. For example, each page buffer may be configured to read or program M-bit data (M is an integer equal to or larger than 3).

The column selector 500 may be configured to select the page buffers in predetermined units under regulation by the controller 600. In addition, the interface block 800 may be configured to interface with an external system (e.g., a memory controller or a host). In particular, the interface block 800 may include a buffer for a dual buffering operation and one or more components which control the dual buffering operation.

The time slot register 700 may be configured to store the time slot information read out from the spare region 102 of the memory cell array 100. At a time of power-up or when there is a need of the refresh operation, the time slot data may be stored into the time slot register 700 by way of the page buffer circuit 400 and the column selector 500 under regulation of the controller 600. Furthermore, when an external system requires a refresh operation (e.g., a memory controller or a computing system), the controller 600 operates to regulate the refresh operation for memory blocks in accordance with the time slot information stored in the time slot register 700.

For example, the controller 600 determines whether a memory block to be selected belongs to the first or second refresh field, and determines whether a time of the time slot information for a memory block to be selected is over a reference time. Here, the reference time includes first and second reference times. In an exemplary embodiment, the first time is set to be longer than the second time. When a memory block to be selected belongs to the first refresh field, the controller 600 determines whether the time slot information of the memory block to be selected has data whose time slots are longer than the first reference time. Similarly, when a memory block to be selected belongs to the second refresh field, the controller 600 determines whether the time slot information of the memory block to be selected has data whose time slots are longer than the second reference time. The controller 600 regulates the high voltage generator 300 in accordance with a result of the determination. For example, if time data of the time slot information in a memory block to be selected is determined as being longer than the first reference time, the controller 600 regulates the high voltage generator 300 to output a first refresh-verifying voltage V2 (see FIG. 4) as a word line voltage. Furthermore, the first refresh-verifying voltage V2 is applied to a row/page selected by the row selector 200. On the other hand, if time data of the time slot information in a memory block to be selected is determined as being longer than the second reference time, the controller 600 regulates the high voltage generator 300 to output a second refresh-verifying voltage V3 (see FIG. 4) as a word line voltage. The second refresh-verifying voltage V3 is also applied to a row/page selected by the row selector 200.

In an exemplary embodiment, the first refresh-verifying voltage V2 is lower than the second refresh-verifying voltage V3. Furthermore, the second refresh-verifying voltage V3 is leveled between the first refresh-verifying voltage V2 and a program-verifying voltage V4 (see FIG. 4). Alternatively, the first refresh-verifying voltage V2 may be set on the same level with the second refresh-verifying voltage V3. Moreover, relations among the first and second refresh-verifying voltages V2 and V3 and the program-verifying voltage V4 may be variable, as will be described later. In addition, the row selector 200, the high voltage generator 300, the page buffer circuit 400, and the column selector 500 are regulated by the controller 600. This combination of components constitutes the circuitry which conducts reading/programming operations.

Thus, as described above, in an exemplary embodiment, the flash memory device is configured to execute the refresh operation for the memory blocks on the basis of different conditions. With such a scheme of the refresh operation, it is possible to prevent degradation of operational performance thereby in a flash memory device and a memory system including the flash memory device.

Figure 3:
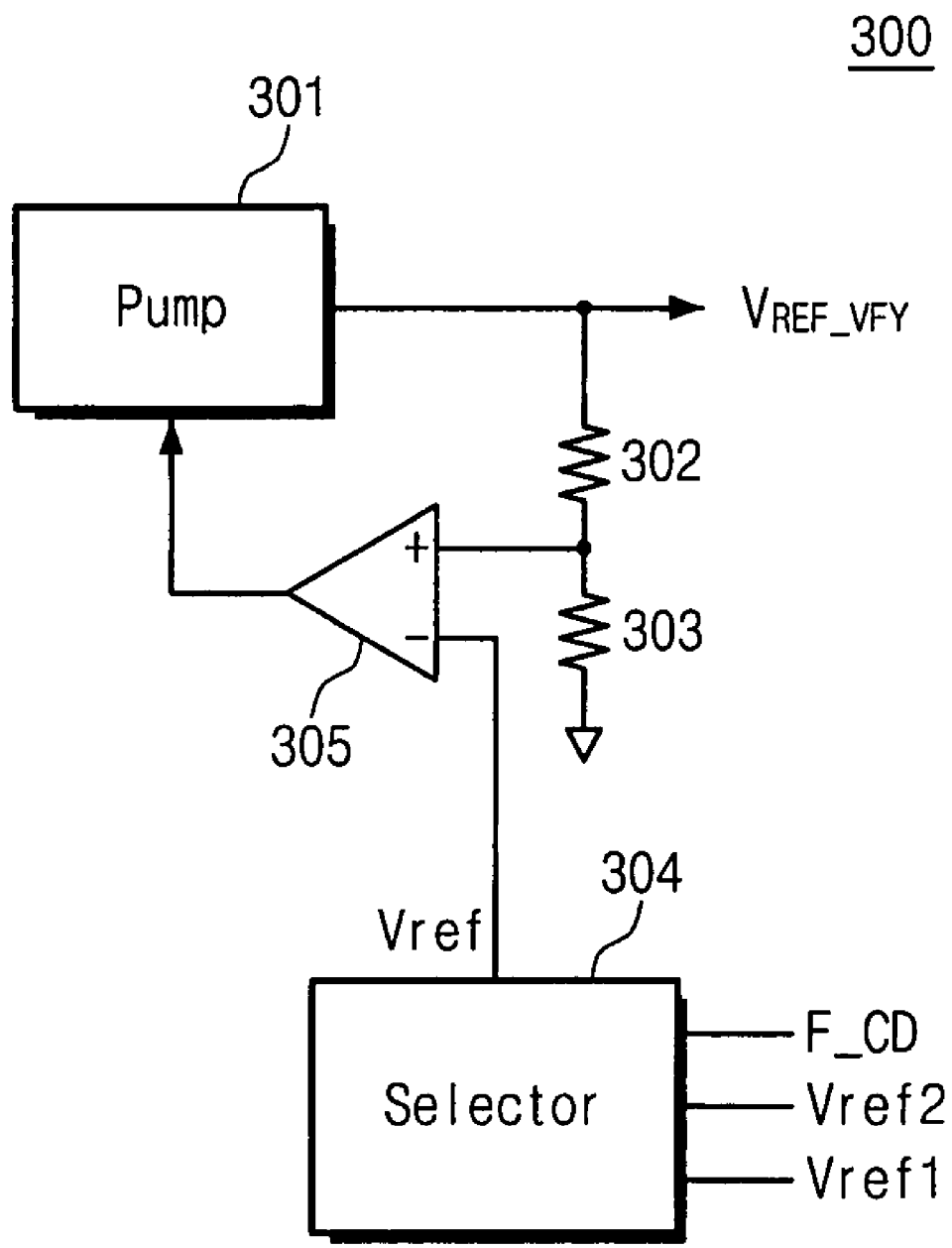
FIG. 3 is a block diagram partially showing the high voltage generator shown in FIG. 2 according to an exemplary disclosed embodiment.
Figure 4:
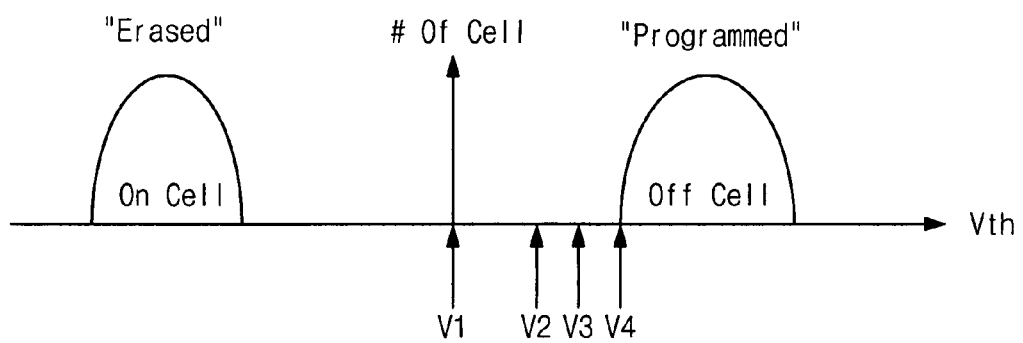
FIG. 4 is a diagram showing relations between refresh-verifying voltages and program-verifying voltages.

FIG. 3 is a block diagram partially showing the high voltage generator 300 shown in FIG. 2, and FIG. 4 is a diagram showing relations between the refresh-verifying and program-verifying voltages V2 through V4. Referring to FIG. 3, the high voltage generator 300 shown in FIG. 3 is comprised of a circuit which generates a refresh-verifying voltage $V_{REF\_VFY}$ (hereinafter, referred to as 'refresh-verifying voltage generator'). Although not shown, the high voltage generator 300 may include circuits for generating varieties of voltages such as a program voltage, an erasing voltage, program/read-verifying voltages, etc.

Referring to FIG. 3, in an exemplary embodiment, the refresh-verifying voltage generator 301 is comprised of a pump 301, resistors 302 and 303, a selector 304, and a comparator 305, which are interconnected as shown in FIG. 3. The selector 304 receives first and second reference voltages Vref1 and Vref2 that are different from each other, and selects one of the first and second reference voltages in response to a selection signal F_CD. The selected voltage is provided to the comparator 305 as a reference voltage. The selection signal F_CD is provided from the controller 600 of FIG. 2, and indicates whether a memory block to be selected is to be included in the first or second refresh field. For instance, referring to FIG. 4, when the selection signal F_CD indicates that the memory block to be selected is included in the first refresh field, the refresh-verifying voltage generator operates to generate the first refresh-verifying voltage V2. On the other hand, when the selection signal F_CD informs that the memory block to be selected is included in the second refresh field, the refresh-verifying voltage generator operates to generate the second refresh-verifying voltage V3. Furthermore, the first refresh-verifying voltage V2 is lower than the second refresh-verifying voltage V3, while the second refresh-verifying voltage V3 is lower than the program-verifying voltage V4. Alternatively, the second refresh-verifying voltage V3 may be set on the same level with the program-verifying voltage V4.

Figure 5:
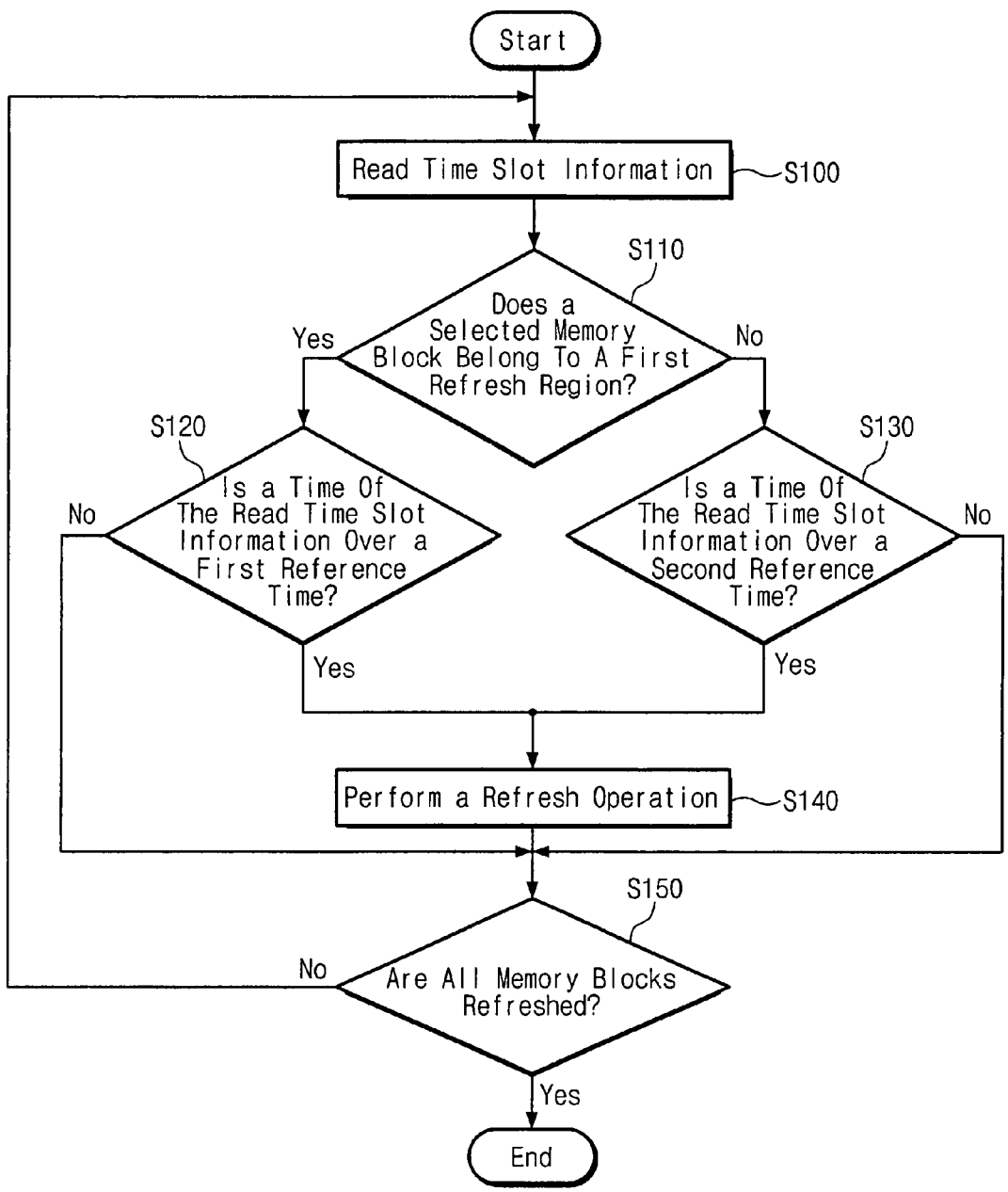
FIGS. 5 through 10 are flow charts showing refresh operations in accordance with exemplary disclosed embodiments.

FIG. 5 is a flow chart showing the refresh operation according to an exemplary disclosed embodiment. Specifically, the flow chart shown in FIG. 5 is provided for explaining the refresh operation under the assumption that the refresh-verifying voltage is maintained on a constant level, without regards to which of the refresh fields includes a memory block to be selected. Furthermore, the reference time is set in accordance with the corresponding refresh field.

At the beginning of the refresh operation, the controller 600 reads time slot information, i.e., time slot information of a memory block (or page), from the time slot register 700 (S100). Next, it determines whether the memory block corresponding to the read time slot information is located in the first refresh field (S110). If the memory block corresponding to the read time slot information is located in the first refresh field, the procedure goes to a step S120. If the memory block corresponding to the read time slot information is located out of the first refresh field, i.e., if the memory block corresponding to the read time slot information is located in the second refresh field, the procedure goes to a step S130. As aforementioned, the first refresh field corresponds with a first storage field (i.e., the lower P/E cycle area) or/and the lower reliability area (i.e., the normal data area), while the second refresh field is correspondent with a second storage field (i.e., the higher P/E cycle area) or/and the higher reliability area (i.e., the code data area).

At the step S120, the controller 600 determines whether a time of the time slot information read from the time slot register 700 is longer than the first reference time. If the time of the read time slot information is determined not to be longer than the first reference time, the procedure goes to a step S150. However, if the time of the read time slot information is determined to be longer than the first reference time, the controller 600 conducts the refresh operation (S140). For example, at S140, the controller 600 regulates the high voltage generator 300 to generate the refresh-verifying voltage. During this time, the refresh-verifying voltage may be one of the first and second verifying voltages V2 and V3 shown in FIG. 4. Furthermore, the refresh-verifying voltage is applied to a selected page of the memory block by way of the row selector 200. During this time, the controller 600 regulates the page buffer circuit 400 to read data from memory cells of a selected page and to program the memory cells of the selected page in accordance with the read data. As a result of the refresh operation, memory cells with threshold voltages between the refresh-verifying voltage and the read voltage V1 of FIG. 4 are refreshed (or reprogrammed) to have threshold voltages equal to or higher than the refresh-verifying voltage. This refresh operation is carried out for all word lines (or pages) belonging to a selected memory block in sequence. Then, the procedure goes to the step S150.

Returning to the step S110, if a memory block corresponding to read time slot information is located out of the first refresh field, i.e., a memory block corresponding to read time slot information is located in the second refresh field, the controller determines whether a time of the read time slot information is longer than the second reference time (S130). If the time of the read time slot information is not longer than the second reference time and is smaller than the first reference time, the procedure goes to the step S150. However, if the time of the read time slot information is determined as being longer than the second reference time, the controller 600 conducts the refresh operation (S140). For example, the controller 600 regulates the high voltage generator 300 to generate the refresh-verifying voltage. Here, the refresh-verifying voltage is identical to the refresh-verifying voltage (e.g., V2) used in the refresh operation aforementioned by the step S120. This refresh-verifying voltage is applied to a selected page of the memory block through the row selector 200. During this time, the controller 600 regulates the page buffer circuit 400 to read data from memory cells of a selected page and to program the memory cells of the selected page in accordance with the read data. As a result of the refresh operation, memory cells with threshold voltages between the refresh-verifying voltage and the read voltage V1 of FIG. 4 are refreshed (or reprogrammed) to have threshold voltages equal to or higher than the refresh-verifying voltage. This refresh operation is carried out for all word lines (or pages) belonging to a selected memory block in sequence. Then, the procedure goes to the step S150.

At step S150, the controller 600 determines whether all memory blocks of the memory cell array 100 have been refreshed. If all memory blocks of the memory cell array 100 have not been refreshed yet, the procedure goes to the step S100. If all memory blocks of the memory cell array 100 have been refreshed, the refresh operation is terminated.

Figure 6:
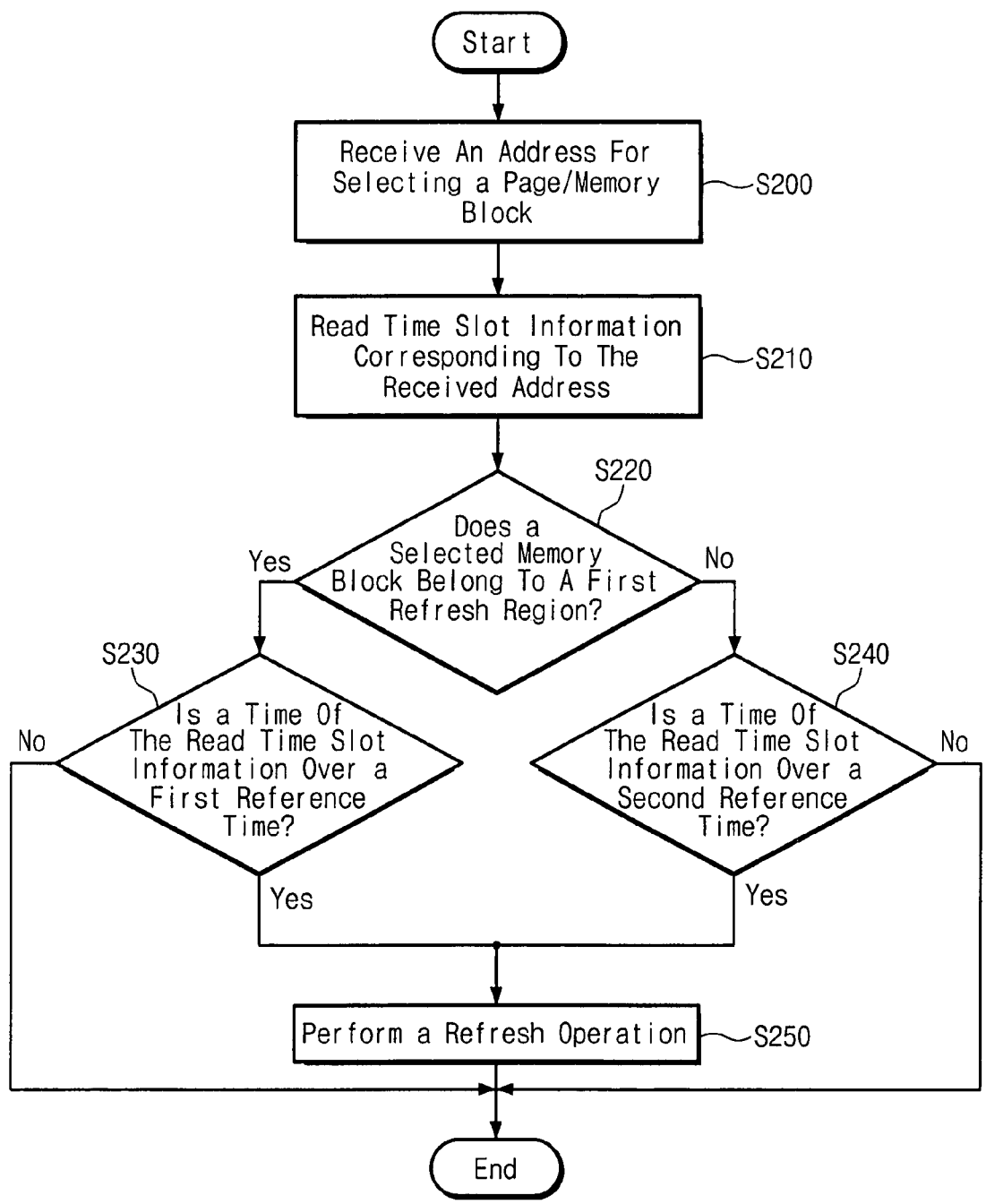

FIG. 6 is a flow chart showing the refresh operation in accordance with an alternative exemplary embodiment. The flow chart shown in FIG. 6 is provided for explaining the refresh operation under the assumption that the refresh-verifying voltage is maintained at a constant level, without regards to which of the refresh fields includes a memory block to be selected, and the reference time is set in accordance with the corresponding refresh field.

At step S200, an address is input into the flash memory device 1000 for selecting a page or memory block, along with a refresh command. Next, the controller 600 reads time slot information from the time slot register 700 in correspondence with the input address (S210). If a memory block corresponding to the read time slot information is located in the first refresh field, the procedure goes to a step S230. If the memory block corresponding to the read time slot information is located out of the first refresh field, i.e., if the memory block corresponding to the read time slot information is located in the second refresh field, the procedure goes to a step S240.

The steps S230 and S240 correspond with the aforementioned steps S120 and S130 shown in FIG. 5 and, therefore, will not be described here. At step S250, the refresh operation is carried out under regulation by the controller. The step S250 corresponds with the aforementioned step S150 of FIG. 5 and, therefore, will not be described here. As a result of the refresh operation, memory cells with threshold voltages between the refresh-verifying voltage and the read voltage V1 of FIG. 4 are refreshed (or reprogrammed) to have threshold voltages equal to or higher than the refresh-verifying voltage. Then, the refresh operation is terminated.

Figure 7:
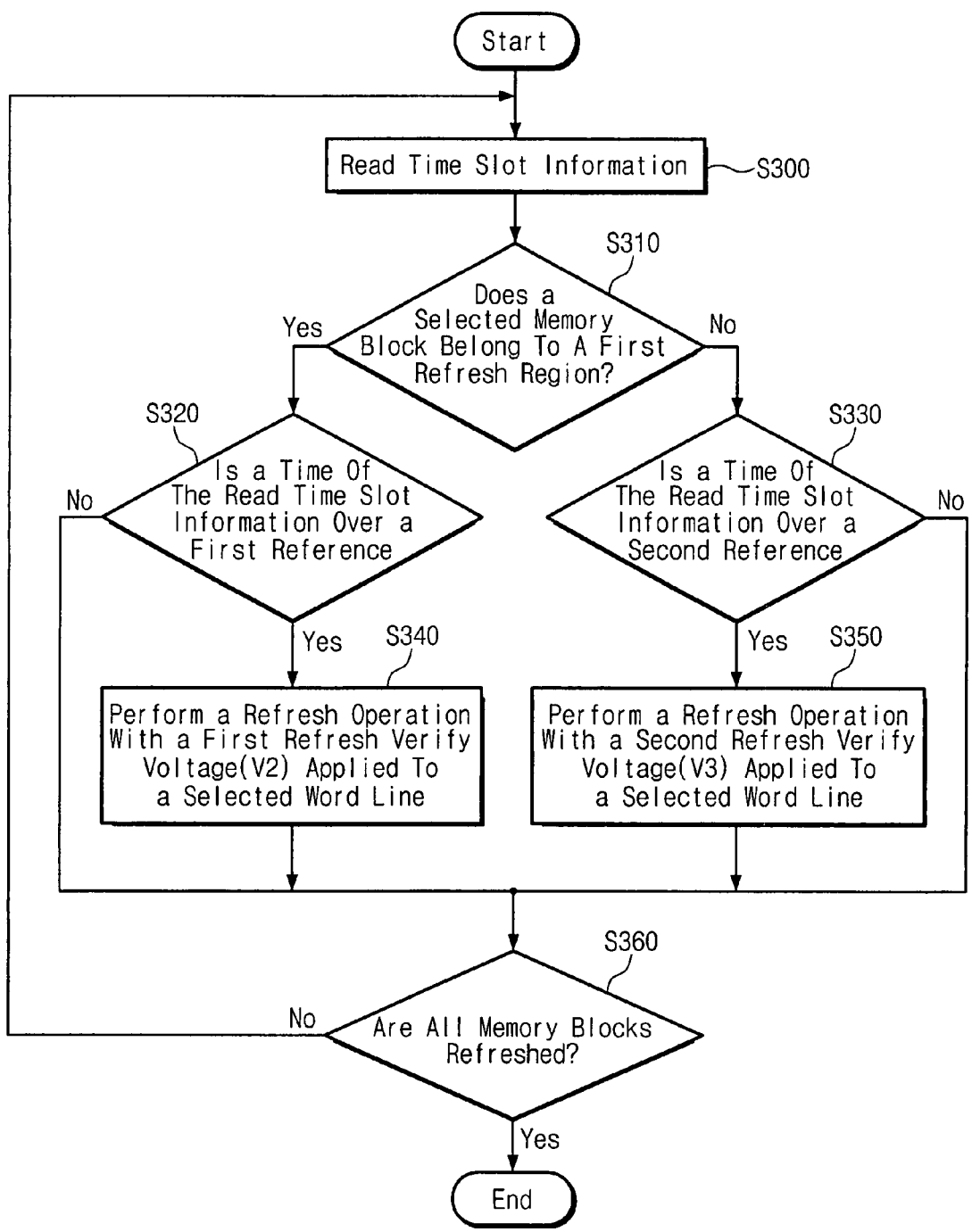

FIG. 7 is a flow chart showing the refresh operation in accordance with yet another alternative exemplary embodiment. The flow chart shown in FIG. 7 is provided for explaining the refresh operation under the assumption that the refresh-verifying voltage and the reference time are set in correspondence with the refresh fields and, therefore, may not be at a constant level.

At the beginning of the refresh operation, the controller 600 reads time slot information, i.e., time slot information of a memory block (or page), from the time slot register 700 (S300). Next, it determines whether the memory block corresponding to the read time slot information is located in the first refresh field (S310). If the memory block corresponding to the read time slot information is located in the first refresh field, the procedure goes to a step S320. At S320, the controller 600 determines whether a time of the time slot information read from the time slot register 700 is longer than the first reference time. If the time of the read time slot information is determined not to be longer than the first reference time, the procedure goes to a step S360. However, if the time of the read time slot information is determined to be longer than the first reference time, the controller 600 conducts the refresh operation (S340). For example, the controller 600 regulates the high voltage generator 300 to generate the first refresh-verifying voltage V2. Furthermore, the first refresh-verifying voltage V2 is applied to a selected page of the memory block by way of the row selector 200. During this time, the controller 600 regulates the page buffer circuit 400 to read data from memory cells of a selected page and to program the memory cells of the selected page in accordance with the read data. As a result of the refresh operation, memory cells with threshold voltages between the first refresh-verifying voltage V2 and the read voltage V1 are refreshed (or reprogrammed) to have threshold voltages equal to or higher than the first refresh-verifying voltage V2. This refresh operation is carried out for all word lines (or pages) belonging to a selected memory block in sequence. Then, the procedure goes to the step S360.

If the memory block corresponding to the read time slot information is located out of the first refresh field, i.e., if the memory block corresponding to the read time slot information is located in the second refresh field, the procedure goes to a step S340. At the step S340, the controller determines whether a time of the read time slot information is longer than the second reference time. If the time of the read time slot information is not longer than the second reference time, the procedure goes to the step S360. However, if the time of the read time slot information is determined as being longer than the second reference time, the controller 600 conducts the refresh operation (S350). For example, the controller 600 regulates the high voltage generator 300 to generate the second refresh-verifying voltage V3. The second refresh-verifying voltage V3 is applied to a selected page of the memory block through the row selector 200. During this time, the controller 600 regulates the page buffer circuit 400 to read data from memory cells of a selected page and to program the memory cells of the selected page in accordance with the read data. As a result of the refresh operation, memory cells with threshold voltages between the second refresh-verifying voltage V3 and the read voltage V1 are refreshed (or reprogrammed) to have threshold voltages equal to or higher than the refresh-verifying voltage. This refresh operation is carried out for all word lines (or pages) belonging to a selected memory block in sequence. Then, the procedure goes to the step S360.

At step S360, the controller 600 determines whether all memory blocks of the memory cell array 100 have been refreshed. If all memory blocks of the memory cell array 100 have not been refreshed yet, the procedure goes to the step S300. If all memory blocks of the memory cell array 100 have been refreshed, the refresh operation is terminated.

Figure 8:
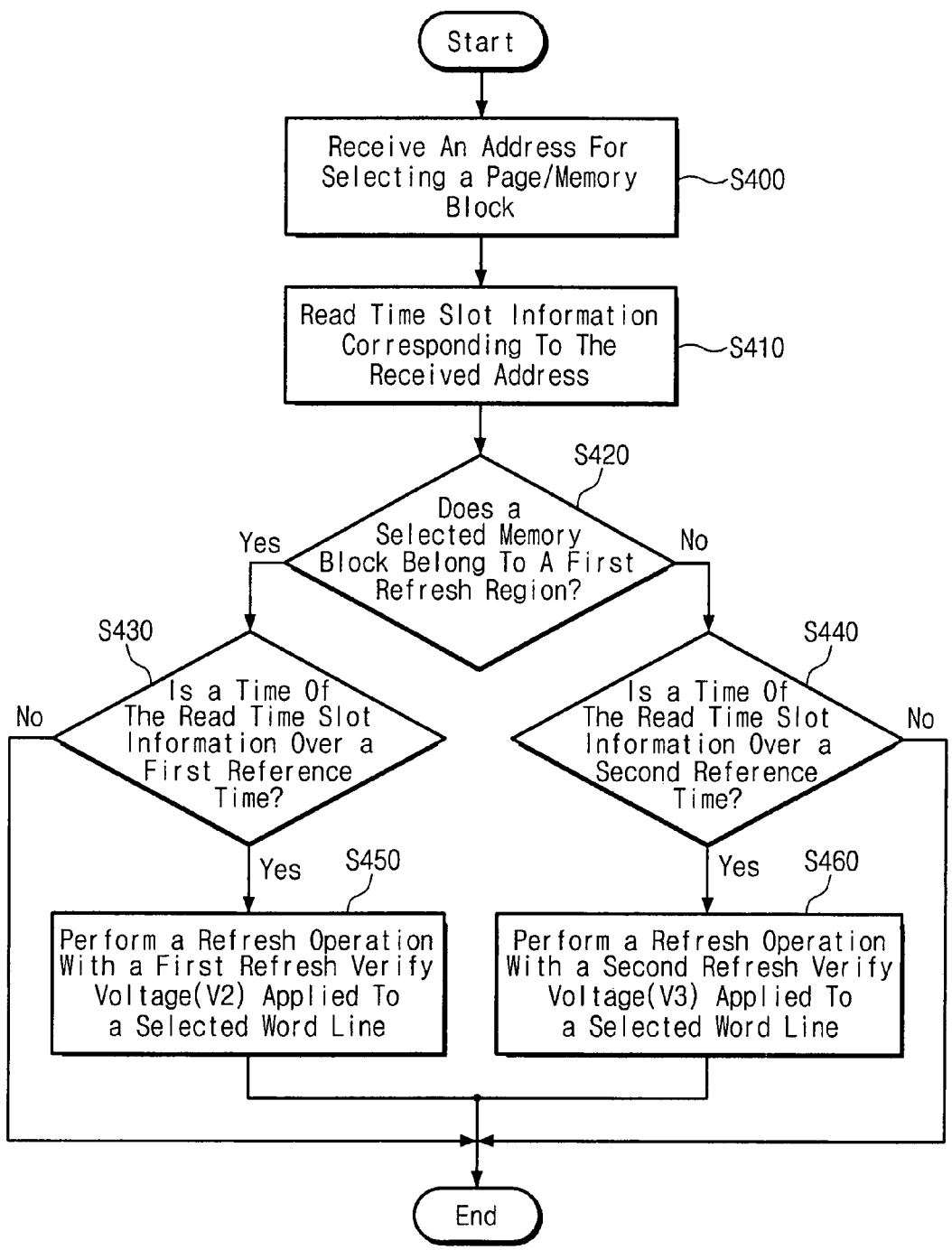

FIG. 8 is a flow chart showing the refresh operation in accordance with an alternative exemplary embodiment. The flow chart shown in FIG. 6 is provided for explaining the refresh operation under the assumption that the refresh-verifying voltage and the reference time are set in accordance with the refresh fields and, therefore, may not be at a constant level.

First, at a step S400, an address is provided into the flash memory device 1000 for selecting a page or memory block, along with a refresh command. Next, the controller 600 reads time slot information from the time slot register 700 that corresponds with the input address (S410). If a memory block corresponding to the read time slot information is located in the first refresh field, the procedure goes to a step S430. At the step S430, the controller 600 determines whether a time of the read time slot information is longer than the first reference time. If the time of the read time slot information is not longer than the first reference time, the procedure is terminated. However, if the time of the read time slot information is determined as being longer than the first reference time, the controller 600 conducts the refresh operation (S440). The refresh operation by the step S440 is substantially identical to the aforementioned step S330 of FIG. 7 and, therefore, will not be described here. Then, the refresh operation is terminated. If at step S420, the memory block corresponding to the read time slot information is located out of the first refresh field, the procedure goes to a step S440. At the step S440, the controller 600 determines whether a time of the read time slot information is longer than the second reference time. If the time of the read time slot information is not longer than the second reference time, the procedure is terminated. However, if the time of the read time slot information is determined as being longer than the second reference time, the controller 600 conducts the refresh operation (S460). The refresh operation by the step S460 is substantially identical to the aforementioned step D350 of FIG. 7 and, therefore, will not be described here. Then, the refresh operation is terminated.

Figure 9:
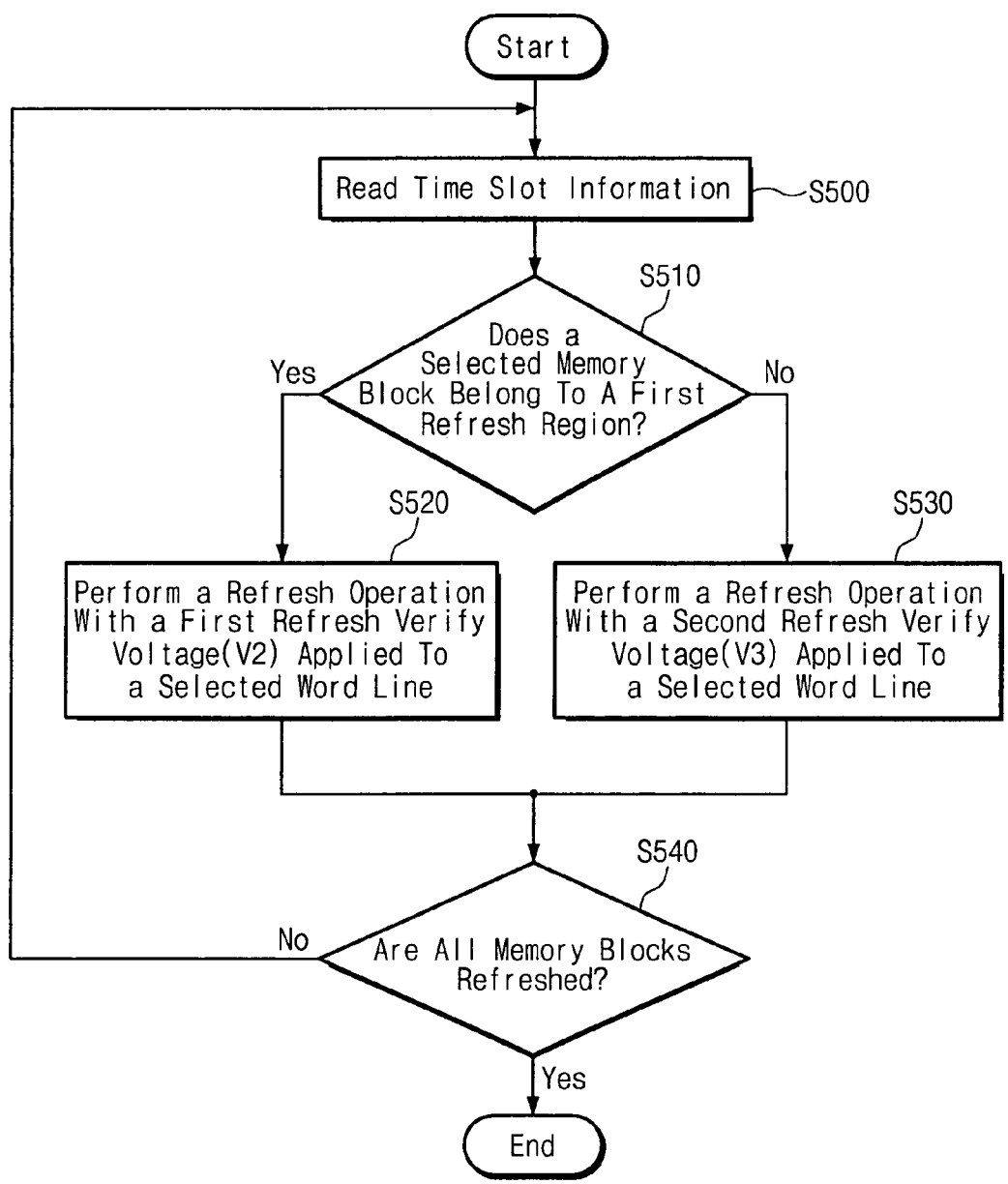

FIG. 9 is a flow chart showing the refresh operation in accordance with an alternative exemplary embodiment. The flow chart shown in FIG. 9 is provided for explaining the refresh operation under the assumption that the refresh-verifying voltage is set in accordance with the refresh fields and the reference time is set at a constant without regards to the refresh fields.

At the beginning of the refresh operation, the controller 600 reads time slot information, i.e., time slot information of a memory block (or page), from the time slot register 700 (S500). Next, the controller 600 determines whether the memory block corresponding to the read time slot information is located in the first refresh field (S510). If the memory block corresponding to the read time slot information is located in the first refresh field, the procedure goes to a step S520. At the step S520, the controller 600 conducts the refresh operation. For example, the controller 600 regulates the high voltage generator 300 to generate the first refresh-verifying voltage V2. The first refresh-verifying voltage V2 is applied to a selected page of the memory block by way of the row selector 200. Under this condition, the refresh operation is carried out, which is substantially same with the aforementioned feature in the step S340 of FIG. 7. Then, the procedure goes to a step S540.

If the memory block corresponding to the read time slot information is located out of the first refresh field, i.e., if the memory block corresponding to the read time slot information is located in the second refresh field, the procedure goes to a step S530. At the step S530, the controller 600 conducts the refresh operation. For example, the controller 600 regulates the high voltage generator 300 to generate the second refresh-verifying voltage V3. The second refresh-verifying voltage V3 is applied to a selected page of the memory block through the row selector 200. Under this condition, the refresh operation is carried out, which is substantially same with the aforementioned feature in the step S350 of FIG. 7.

At the step S540, the controller 600 determines whether all memory blocks of the memory cell array 100 have been refreshed. If all memory blocks of the memory cell array 100 have not been refreshed yet, the procedure goes to the step S500. However, if all memory blocks of the memory cell array 100 have been refreshed, the refresh operation is terminated.

Figure 10:
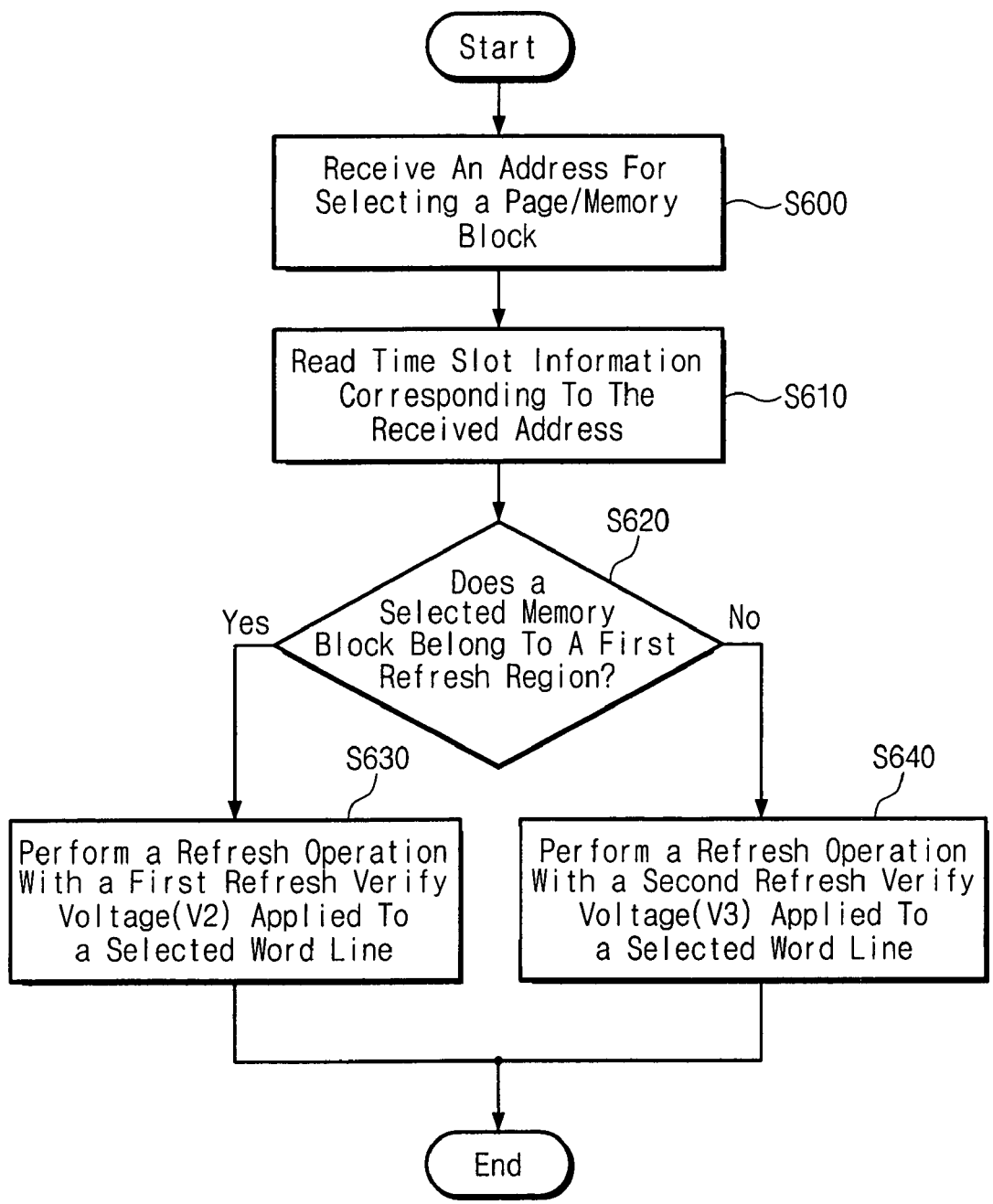

FIG. 10 is a flow chart showing the refresh operation in accordance with another exemplary embodiment. The flow chart shown in FIG. 10 is provided for explaining the refresh operation under the assumption that the refresh-verifying voltage is set in accordance with the refresh fields and the reference time is set at a constant level without regard to the refresh fields.

At a step S400, an address is provided into the flash memory device 1000 for selecting a page or memory block, along with a refresh command. Next, the controller 600 reads time slot information from the time slot register 700 in correspondence with the input address (S610). The controller 600 determines whether a memory block/page corresponding to the read time slot information is located in the first refresh field (S620). If the memory block/page corresponding to the read time slot information is located in the first refresh field, the procedure goes to a step S630.

At the step S630, the controller 600 conducts the refresh operation. For example, the controller 600 regulates the high voltage generator 300 to generate the first refresh-verifying voltage V2. The first refresh-verifying voltage V2 is applied to a selected page of the memory block through the row selector 200. Under this condition, the refresh operation is carried out, which is substantially same with the aforementioned feature in the step S340 of FIG. 7. Then, the refresh operation is terminated.

If the memory block corresponding to the read time slot information is located out of the first refresh field, i.e., if the memory block corresponding to the read time slot information is located in the second refresh field, the procedure goes to a step S640. At the step S640, the controller 600 conducts the refresh operation. For example, the controller 600 regulates the high voltage generator 300 to generate the second refresh-verifying voltage V3. The second refresh-verifying voltage V3 is applied to a selected page of the memory block through the row selector 200. Under this condition, the refresh operation is carried out, which is substantially same with the aforementioned feature in the step S350 of FIG. 7. Then, the refresh operation is terminated.

As mentioned above, flash memory devices are a type of nonvolatile memories that are capable of keeping data stored therein even without power supply. Furthermore, there has been a rapid increase in the use of flash memories in mobile apparatuses such as cellular phones, personal digital assistants (PDA), digital cameras, portable gaming consoles, and MP3 as code storage units and data storage units. In addition, the flash memory devices may be also utilized in home applications such as high-definition TVs, digital versatile disks (DVDs), routers, and global positioning systems (GPSs).

Figure 11:
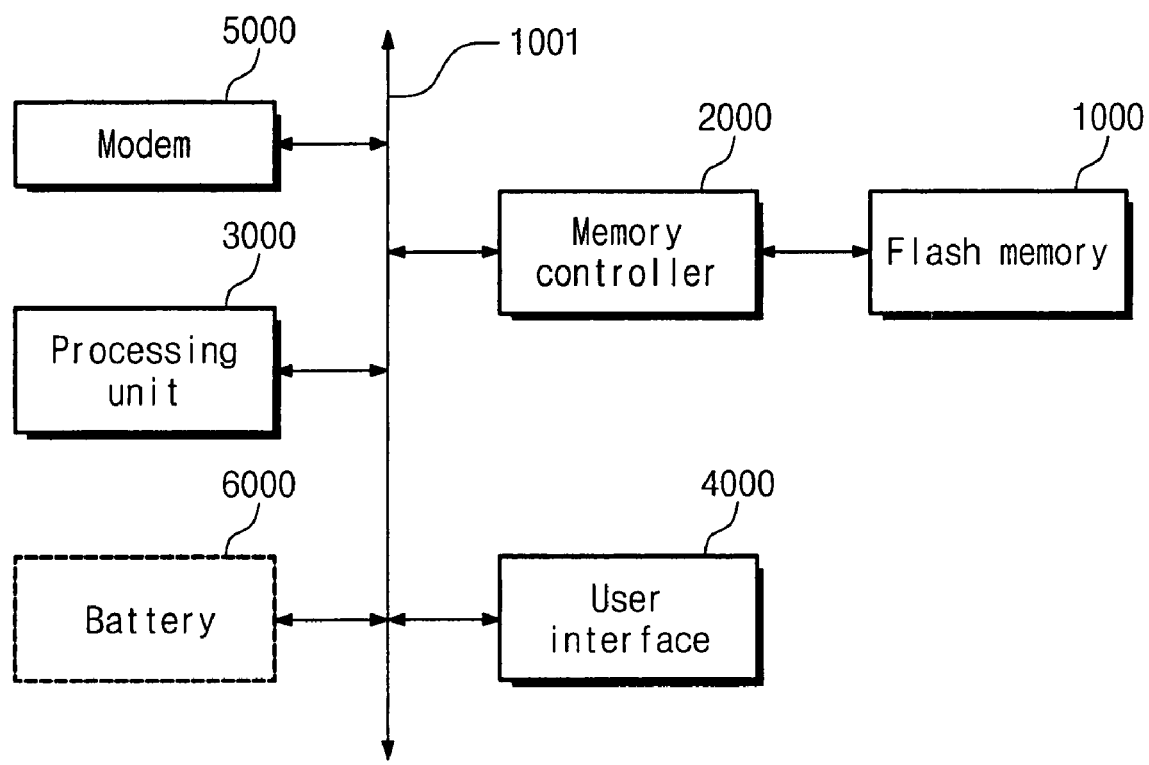
FIG. 11 is a block diagram showing a schematic computing system including the flash memory device according to an exemplary disclosed embodiment.

FIG. 11 is a block diagram showing a schematic computing system including an exemplary disclosed flash memory device. The computing system according to an exemplary disclosed embodiment is organized by including a processing unit 3000 such as a microprocessor or a central processing unit, a user interface 4000, a modem 5000 such as a baseband chipset, a memory controller 2000, and the flash memory device 1000. In the flash memory device 1000, N-bit data (N is a positive integer) to be processed by the processing unit 3000 are stored through the memory controller 2000. If the computing system shown in FIG. 11 is a mobile apparatus, it may further include a battery 6000 which supplies power thereto. Although not shown in FIG. 11, the computing system may be further equipped with an application chipset, a camera image processor (e.g., CMOS image sensor; CIS), a mobile DRAM, etc.

As stated above, the disclosed flash memory device is configured to conduct the refresh operation of memory blocks with reference to different parameters in accordance with the number of programming/erasing cycles for each memory block. By using the disclosed refresh operation scheme, it may be possible to prevent a degradation of the operational performance in a flash memory device and a memory system including the flash memory device.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for refreshing a flash memory device, comprising:
   providing first and second refresh fields that include a plurality of memory blocks; and
   determining, when there is a request for a refresh, a condition of a memory block to be refreshed in accordance with which of the first and second refresh fields includes the memory block to be refreshed,
   wherein the first refresh field includes one of a lower programming/erasing cycle area, a normal data area, and a lower reliability area, while the second refresh field includes one of a higher programming/erasing cycle area, a code data area, and a higher reliability area.

2. The method as set forth in claim 1, wherein reference times for determining refresh times are set to different values for the first and second refresh fields in accordance with which of the first and second refresh fields includes the memory block to be refreshed.

3. The method as set forth in claim 2, wherein the reference time for determining the refresh time of the first refresh field is longer than the reference time for determining the refresh time of the second refresh field.

4. The method as set forth in claim 1, wherein refresh-verifying voltages which detect memory cells to be refreshed are set to different values for the first and second refresh fields in accordance with which of the first and second refresh fields includes the memory block to be refreshed.

5. The method as set forth in claim 4, wherein the refresh-verifying voltage which detects a memory cell to be refreshed in the first refresh field is lower than the refresh-verifying voltage which detects a memory cell to be refreshed in the second refresh field.

6. The method as set forth in claim 1, wherein refresh-verifying voltages which detect memory cells to be refreshed and reference times which determine refresh times are set to different values for the first and second refresh fields in accordance with which of the first and second refresh fields includes the memory block to be refreshed.

7. The method as set forth in claim 6, wherein the reference time which determines the refresh time of the first refresh field is longer than the reference time which determines the refresh time of the second refresh field, wherein the first refresh-verifying voltage which detects a memory cell to be refreshed in the first refresh field is lower than the second refresh-verifying voltage which detects a memory cell to be refreshed in the second refresh field.

8. The method as set forth in claim 7, wherein the second refresh-verifying voltage is equal to or lower than a program-verifying voltage.

9. The method as set forth in claim 1, wherein the first and second refresh fields store N-bit data, wherein N is an integer.

10. The method as set forth in claim 1, wherein each memory block of the first and second refresh fields is structured in NAND strings.

11. A method for refreshing a flash memory device, comprising:
providing first and second refresh fields that include a plurality of memory blocks;
reading time slot information including data associated with times for programming the memory blocks, from the first and second refresh fields;
determining, when there is a request for a refresh, which of the first and second refresh fields includes the memory block to be refreshed;
selecting one of first and second reference times which are compared with the programming time of the time slot information corresponding to the memory block to be refreshed; and
executing a refresh operation in accordance with whether the programming time of the time slot information corresponding to the memory block to be refreshed is longer than the selected reference time.

12. The method as set forth in claim 11, wherein the first refresh field includes one of a lower programming/erasing cycle area, a normal data area, and a lower reliability area, while the second refresh field includes one of a higher programming/erasing cycle area, a code data area, and a higher reliability area.

13. The method as set forth in claim 12, wherein the first reference time is longer than the second reference time.

14. The method as set forth in claim 13, wherein the first reference time is selected when the memory block to be refreshed is included in the first refresh field.

15. The method as set forth in claim 13, wherein the second reference time is selected when the memory block to be refreshed is included in the second refresh field.

16. The method as set forth in claim 11, wherein a refresh-verifying voltage which detects a memory cell to be refreshed is set at a same level independent of which of the refresh fields includes the memory block to be refreshed.

17. The method as set forth in claim 11, wherein the first and second refresh fields store N-bit data, N being an integer.

18. A method for refreshing a flash memory device, comprising:
providing first and second refresh fields that include a plurality of memory blocks;
determining, when there is a request for a refresh, one of first and second refresh-verifying voltages which detect a memory block to be refreshed in accordance with which of the first and second refresh fields includes the memory block to be refreshed; and
executing a refresh operation based on the determined refresh-verifying voltage,
wherein the first refresh field includes one of a lower programming/erasing cycle area, a normal data area, and a lower reliability area, while the second refresh field includes one of a higher programming/erasing cycle area, a code data area, and a higher reliability area.

19. The method as set forth in claim 18, wherein the first refresh-verifying voltage is lower than the second refresh-verifying voltage.

20. The method as set forth in claim 19, wherein the first refresh-verifying voltage is selected when the memory block to be refreshed is included in the first refresh field.

21. The method as set forth in claim 19, wherein the second refresh-verifying voltage is selected when the memory block to be refreshed is included in the second refresh field.

22. A method for refreshing a flash memory device, comprising:
providing first and second refresh fields including a plurality of memory blocks;
reading time slot information including data associated with times for programming the memory blocks, from the first and second refresh fields;
determining, when there is a request for a refresh, which of the first and second refresh fields includes the memory block to be refreshed;
selecting one of first and second reference times which are compared with the programming time of the time slot information corresponding to the memory block to be refreshed;
determining, when the programming time of the time slot information corresponding to the memory block to be refreshed is longer than the selected reference time, one of first and second refresh-verifying voltages which detect a memory cell to be refreshed; and
executing a refresh operation based on the determined refresh-verifying voltage.

23. The method as set forth in claim 22, wherein the first refresh field includes one of a lower programming/erasing cycle area, a normal data area, and a lower reliability area, while the second refresh field includes one of a higher programming/erasing cycle area, a code data area, and a higher reliability area.

24. The method as set forth in claim 23, wherein the first reference time is longer than the second reference time,
wherein the first reference time is selected when the memory block to be refreshed is included in the first refresh field and the second reference time is selected when the memory block to be refreshed is included in the second refresh field.

25. The method as set forth in claim 23, wherein the first refresh-verifying voltage is lower than the second refresh-verifying voltage, wherein the first refresh-verifying voltage is selected when the memory block to be refreshed is included in the first refresh field and the second refresh-verifying voltage is selected when the memory block to be refreshed is included in the second refresh field.

26. The method as set forth in claim 22, wherein each memory block of the first and second refresh fields is structured in NAND strings and stores N-bit data, N being an integer.

27. A method for refreshing a flash memory device, comprising:

provided first and second refresh fields including a plurality of memory blocks; and refreshing a selected memory block when there is a request for a refresh, wherein a refresh cycle for the memory blocks of the first refresh field is longer than a refresh cycle for the memory blocks of the second refresh field, wherein the first refresh field includes one of a lower programming/erasing cycle area, a normal data area, and a lower reliability area, while the second refresh field includes one of a higher programming/erasing cycle area, a code data area, and a higher reliability area.

* * * * *